US006265236B1

(12) United States Patent
Gerner

(10) Patent No.: US 6,265,236 B1
(45) Date of Patent: Jul. 24, 2001

(54) METHOD FOR THE MANUFACTURE OF A LIGHT EMITTING DIODE

(75) Inventor: Jochen Gerner, Wiesloch (DE)

(73) Assignee: Temic Telefunken microelectronic GmbH, Heilbronn (DE)

( * ) Notice: Subject to any disclaimer, the term of this patent is extended or adjusted under 35 U.S.C. 154(b) by 0 days.

(21) Appl. No.: 08/683,432

(22) Filed: Jul. 18, 1996

(30) Foreign Application Priority Data

Oct. 9, 1995 (DE) .............................................. 195 37 545

(51) Int. Cl.$^7$ .................................................. H01L 21/00
(52) U.S. Cl. ................................................. 438/22; 438/29
(58) Field of Search ................................ 438/22, 29, 71, 438/38, 32, 48, 46; 257/98, FOR 157

(56) References Cited

U.S. PATENT DOCUMENTS

| 3,537,028 | * | 10/1970 | Pankove | 257/78 |
| 3,739,217 | | 6/1973 | Bergh et al. | |
| 3,896,254 | * | 7/1975 | Berkner | 428/411 |

(List continued on next page.)

FOREIGN PATENT DOCUMENTS

| OS 30 974 | 1/1971 | (DE) . |
| 24 60 831 A1 | 7/1975 | (DE) . |
| 2460831 | 7/1975 | (DE) . |

(List continued on next page.)

OTHER PUBLICATIONS

Sorab K. Ghandhi, VLSI Fabrication Priniples: Silicon and Gallium Arsenide, pp. 639–642, 1994.*
Yee et al., Formation of Ohmic Contacts to N–GaAs Via Heterojunction by using Indium and Gold, IEEE, pp. 614–616, 1988.*
Ismail et al., Schottky diode properties of Au, In–GaP (111) and (100) Chemically etched surfaces, Solid State Electronics, vol. 38, pp. 497–501, 1994.*
L.R. Zheng et al.: "Shallow ohmic contacts to n–type GaAs and $AL_xGa_{1-x}As$". In: Appl. Phys. Lett. 60, (7), Feb. 17, 1992, pp. 877–879.
O. Aina et al.: "Microstructure and Resistivity of Laser–Annealed Au–Ge Ohmic Contacts on GaAs". In: J. Electrochem. Soc.: Solid–State Science and Technology, Oct. 1981, vol. 128, No. 10, pp. 2183–2187.
L. R. Zheng et al.: "Shallow ohmic contacts ot n–type GaAs and $Al_xGa_{1-x}As$". In: Appl. Phys. Lett. 60 (7), Feb. 17, 1992, pp. 877–879.
Masato Yamashita et al.: "Barrier metal against Ga and Zn out–diffusion in p–GaP/Au:Zn contact system". In: J. Appln. Phys. 51 (12), Dec. 1981, pp. 7304–7308.

*Primary Examiner*—Charles Bowers
*Assistant Examiner*—Scott J. Hawranek
(74) *Attorney, Agent, or Firm*—Venable; George H. Spencer; Norman N. Kunitz

(57) ABSTRACT

A method for manufacturing a light emitting diode with the following process steps. Preparation of a substrate; production on the substrate of a series of layers which include the pn junction, that generates the radiation; production of contact layers on the surface of the layers including the pn junction and generating the radiation, and on the rear side of the substrate; and tempering of the contact layers. The method is characterized by the surface of the layers including the pn junction and generating the radiation being frosted or roughened before the contact layers are deposited. Through frosting the front side, it is possible to increase the luminous efficiency of the diodes by about 25%. Since the frost-etching process is performed before the contact layers are produced, this method can be used when aluminum is to be used as the contact material. Since the frosting is restricted to the front side of the diodes and the electrically active pn junction emerges to the surface at the lateral areas, the life of the diodes is not adversely affected by the method.

13 Claims, 3 Drawing Sheets

U.S. PATENT DOCUMENTS

| | | | |
|---|---|---|---|
| 3,940,847 | * | 3/1976 | Park et al. . |
| 3,954,534 | * | 5/1976 | Scifres et al. .......................... 428/29 |
| 3,995,371 | * | 12/1976 | O'Keefe . |
| 4,339,689 | * | 7/1982 | Yamanaka et al. ..................... 438/29 |
| 5,035,789 | * | 7/1991 | Beaver et al. . |
| 5,132,751 |   | 7/1992 | Shibata et al. . |
| 5,162,878 | * | 11/1992 | Sasagawa et al. ..................... 257/78 |
| 5,171,706 | * | 12/1992 | Matsumoto et al. ................... 438/29 |
| 5,420,049 | * | 5/1995 | Russell et al. ......................... 438/22 |

FOREIGN PATENT DOCUMENTS

| | | | |
|---|---|---|---|
| 2719567 |   | 12/1977 | (DE) . |
| 32 00 788 A1 |   | 7/1982 | (DE) . |
| 3200788 |   | 7/1982 | (DE) . |
| 4231007 |   | 3/1994 | (DE) . |
| 4305296 |   | 8/1994 | (DE) . |
| 0035118 |   | 9/1981 | (EP) . |
| 0 404 565 |   | 12/1990 | (EP) . |
| 0404565 |   | 12/1990 | (EP) . |
| 55-43883 | * | 3/1980 | (JP) ...................................... 257/98 |
| 62-54485 | * | 3/1987 | (JP) ...................................... 257/98 |
| 04354382 | * | 12/1992 | (JP) . |

\* cited by examiner

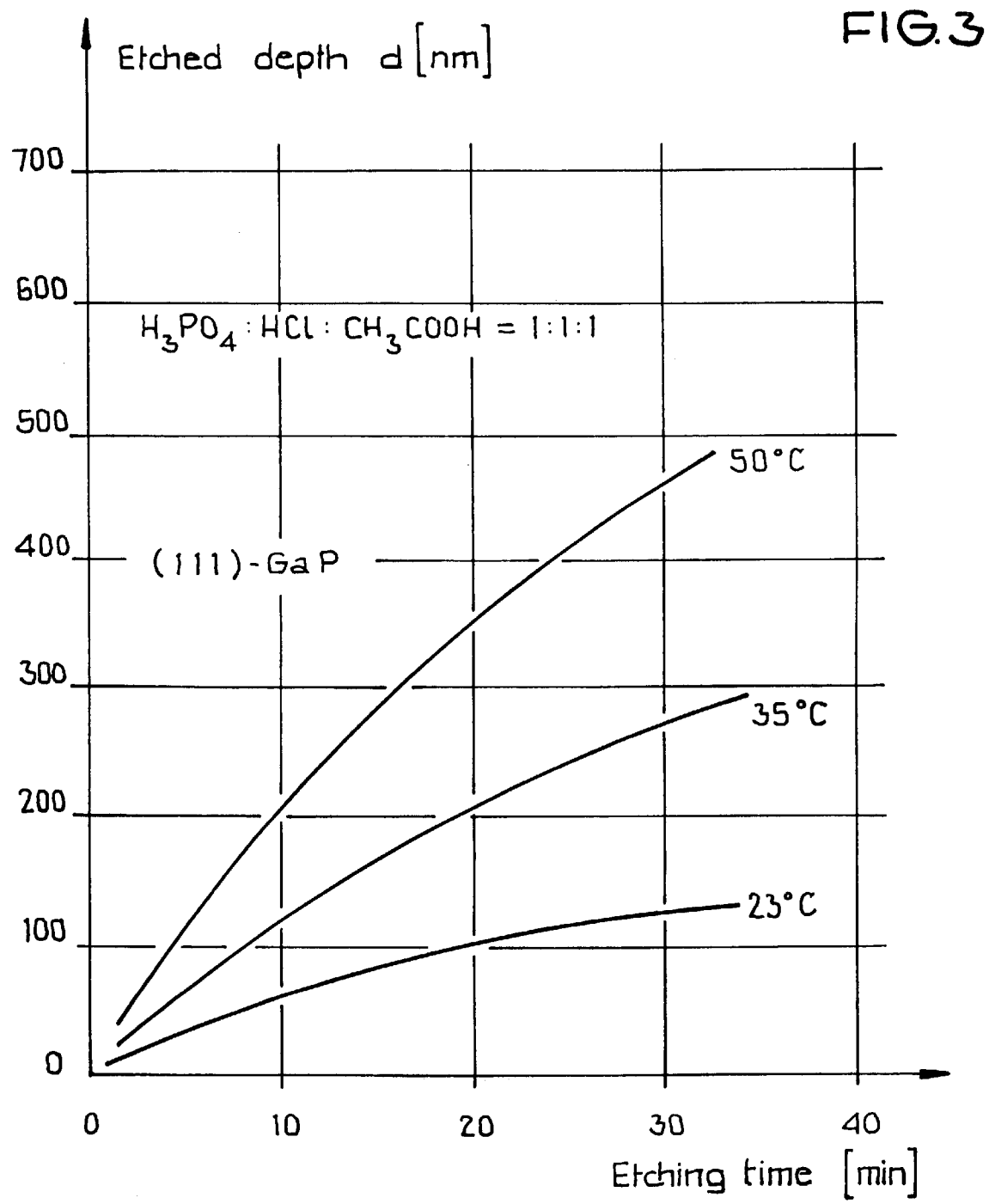

METHOD FOR THE MANUFACTURE OF A LIGHT EMITTING DIODE

BACKGROUND OF THE INVENTION

The invention relates to a method for manufacturing a light emitting diode with a frosted surface.

Green luminous light-emitting diodes are made from (1 1 1)-oriented gallium phosphide. Since gallium phosphide is an indirect semiconductor, the efficiency is lower than in mixed crystal systems where, with a suitable composition, direct band-to-band transitions are also possible. The external quantum efficiency, which is determined by the material property of internal quantum efficiency and by the losses which occur when the radiation emerges from within the diode, is no more than 0.3% for GaP diodes.

One reason for the poor efficiency of the diodes is the high proportion of radiation that cannot escape from the body of the diode because of the total reflection on the surface of the semiconductor. This is due to the high optical refractive index of the semiconductor material. This is approximately 3.4 for gallium phosphide. This results in a critical angle of total reflection of 17.7° on emergence of the radiation to air. By direct means, only that proportion of the radiation is emitted that falls on the boundary layer at a smaller angle to the surface normal. The remainder is reflected back into the diode body. A large part of the radiation reflected back is lost due to absorption in the semiconductor body and at the metal contacts. The efficiency can therefore be increased considerably if the emission of the radiation is improved.

In principle, there are many means of improving radiation emission from the interior. In the patent publication DE 42 31 007 A1, a method is described for increasing the critical angle of total reflection by applying a $\lambda/4$-thick antireflective coating.

From EP 404 565, a method for manufacturing a radiation-emitting diode made from the III–V compound-semiconductor material GaAlAs is known where the entire surface of the semiconductor chip is roughened in order to improve the external quantum efficiency. The roughening or frosting takes place after the diodes have been singled out. By frosting, the total reflection of the radiation generated at the boundary layer between the diode chip and the surrounding material is largely avoided, the light path in the semiconductor material is shortened and thus the probability of reabsorption is reduced. At the same time, the effective surface of the diode is increased in size thereby allowing more radiation to escape from the inside of the diode. A disadvantage of the known method is, however, that the diode chip is very difficult to bond at the time of assembly because of the etched contact layer structures. Also, etch-resistant materials must be used for the contact layer structures. Furthermore, etching of the surface in the region of the radiation-emitting junction results in a reduction of the life of the diodes.

From DE 43 05 296 A1, a method for manufacturing a radiation-emitting diode with frosted side edges is known. Frosting takes place after the substrate wafer has been diced. The diodes are held together in a group by a carrier sheet applied on the rear side. A layer of silicon dioxide protects the contact surfaces, the front side of the diode and the mesa edges with the pn junction that emerge at the surface against attack by etching. The silicon dioxide must be removed again after frosting. The application and removal of the protective layer and the bonding of the carrier sheet make the known method very elaborate.

SUMMARY OF THE INVENTION

The object of the invention is to provide a method for manufacturing a light-emitting diode with a frosted or roughened surface where no further process steps are needed after the diodes have been singled, i.e., individually separated from the wafer.

The method according to the invention for the manufacture of a light emitting diode comprises the following process steps. The layers including the pn transition or junction and generating the radiation are produced on a substrate. Contact layers are made both on the outer surface of the layers including the pn transition, or junction and generating the radiation, and also on the rear surface of the substrate. The contact layers are tempered in order to form ohmic contacts. The method is characterized by the surface of the layers including the pn junction and generating the radiation being or roughened before the contact layers are deposited. The contact layers are not attacked by the frosting. No further process steps are needed after the diodes have been singled or separator.

The substrate is made advantageously of (1 1 1)-oriented gallium phosphide. Equally the series of layers which include the pn transition, that generates the radiation.

Frosting or rough etching of the outer surface of the layers including the pn transition or junction and generating the radiation is performed by wet chemical means with a mixture of phosphoric acid, hydrochloric acid and acetic acid. The ratio of phosphoric acid:hydrochloric acid:acetic acid is 1:1:1. This results in a frosted or roughened surface with a roughness depth of less than 1 $\mu$m.

The contact layers on the surface of the layers including the pn transition and generating the radiation and on the rear side of the substrate are tempered in a single process step.

The method for frosting or rough-etching the surface of a (1 1 1)-oriented GaP semiconductor wafer includes the use of an acid mixture comprising concentrated phosphoric acid $H_3PO_4$, concentrated hydrochloric acid HCl and concentrated acetic acid $CH_3COOH$ in equal volumetric amounts. The temperature of the acid mixture is in the range of 25° C. to 40° C. The semiconductor wafer is frosted or etched for a period of 2–15 minutes in the acid mixture. It is advantageous that the frosting can take place in an open basin because the composition of the frosting substances and the low temperatures result in no vapors that could endanger the health or cause corrosion.

In a particularly advantageous embodiment of the method the temperature of the acid mixture is approximately 30° C. The semiconductor wafers are then frosted rough-etched for about 5 minutes in the acid mixture.

The advantages associated with the method are in particular that the surface of the light emitting diode is frosted or roughened before the front side contact is produced. Frosting takes place in the wafer pack. The contact layer of the front side can be produced on the frosted surface without disadvantages for the function of the diode. This therefore makes it possible to also use less etch-resistant contact metals such as aluminum.

Furthermore, the frosting process is so designed that it can be performed without any special preparations at a relatively low temperature under normal laboratory conditions. The composition of the etching solution has been established in a series of experiments such that the structures that arise when frosting the (1 1 1)-oriented gallium phosphide do not have the pyramid shape with a sharp tip as known from the conventional media. A fine frosted surface with a roughness depth of less than 1 $\mu$m is produced by the method. This is important because otherwise a wire bonding of the contact located above the frosted surface would result in bursts in the semiconductor crystal and in failure of the diode and there would be no guarantee for being able to assemble the diodes.

BRIEF DESCRIPTION OF THE DRAWINGS

FIG. 3 shows the relationship between etched depth and the etching time at different temperatures for the etching solution according to the invention.

DETAILED DESCRIPTION OF THE PREFERRED EMBODIMENTS

An embodiment example of the invention will now be described with reference to the Figures.

Figure 1:
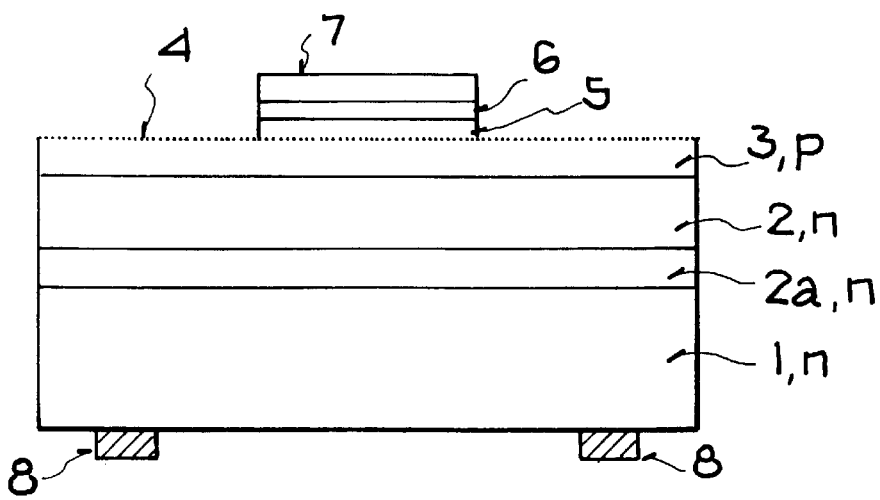
FIG. 1 is a cross-sectional view of a light emitting diode according to the invention.

The light emitting diode shown in FIG. 1 consists of a semiconductor substrate 1 of (1 1 1)-oriented gallium phosphide (GaP). On the n-conducting GaP substrate 1, which is doped for example with tellurium or sulfur, a GaP layer that is also n-conducting is epitaxially applied as first epitaxial layer 2. Like the substrate, the first epitaxial layer 2 is doped with tellurium or sulfur. The concentrations of the doping materials in the substrate material are advantageously in the region of $2-6 \cdot 10^{17}$ cm$^{-3}$ and in the first epitaxial layer 2 advantageously in the region of $1 \cdot 10^{16}$ cm$^{-3}$. Both vapor-phase (VPE) and liquid-phase (LPE) epitaxy methods can be used to produce the epitaxial layers. These days, however, the liquid-phase epitaxy method (LPE) is almost always used. A p-conductive second epitaxial layer 3 of GaP, preferably doped with zinc, is applied on the first epitaxial layer 2, and in this example of embodiment it forms the p-conductive side of the light emitting diode. The concentration of the doping material in the second epitaxial layer 3 is advantageously in the region of $2 \cdot 10^{18}$ cm$^{-3}$.

Diodes with an n-conductive buffer layer 2a placed between the substrate 1 and the first epitaxial layer 2 achieve an even higher efficiency. In the embodiment example, the buffer layer 2a is preferably doped with sulfur, where the concentration of the doping material is in the region of approx. $5 \cdot 10^{16}$ cm$^{-3}$.

For light emitting diodes emitting a yellow-green light, the epitaxial layers 2 and 3 in the proximity of the pn junction are additionally doped with nitrogen in order to produce isoelectronic centers and thus to increase the radiative efficiency and at the same time to accomplish a shift in the emission wavelength. The nitrogen concentration should be in the region of $1 \cdot 10^{19}$ cm$^{-3}$.

The entire surface 4 of the p-conductive epitaxial layer 3 is frosted or roughened in order to improve the light emission from the interior. The roughness depth of the frosted surface must not be greater than the upper value of 1 µm in order for the diodes to be bondable and not to be damaged at the time of assembly.

On the frosted, surface there is a contact layer arrangement 5, 6, 7. With the semiconductor beneath it, this forms an ohmic contact. The contact layer arrangement 5, 6, 7 comprises several contact layers. In the embodiment example, the first contact layer 5 is made of gold-zinc or gold-beryllium. A second contact layer 6 is arranged on it. This acts as diffusion barrier and is made of titanium-tungsten-nitride. On the diffusion barrier, there is a third contact layer 7 made of aluminum. The aluminum layer 7 reinforces the first contact layer 5 and permits good bonding of the diode when assembled at a later time.

Instead of the combination of second contact layer 6 made of titanium-tungsten-nitride and third contact layer 7 made of aluminum, just a single contact layer made of gold can be arranged on the first contact layer 5.

The third contact layer 7 can be made of an AlSi alloy instead of aluminum. AlSi alloys are more resistant to corrosion than pure aluminum.

The metallization on the n-conductive semiconductor surface of the reverse side of the wafer is preferably in the form of a gold-germanium layer 8. The reverse side of the diode is advantageously, though not necessarily, only partially metallized.

Figure 2A:
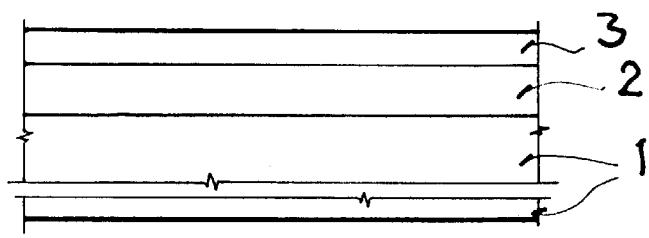
FIG. 2a shows the light emitting diode of FIG. 1 in a first stage of its manufacture.

FIGS. 2a to 2d show a cross-section through the light emitting diode following essential stages in its manufacturing process. First of all, the first and second epitaxial GaP layers 2, 3 are produced on an n-conductive substrate wafer 1 made of (1 1 1)-oriented gallium phosphide. The two epitaxial layers contain/form the radiation-emitting pn junction. FIG. 2a shows the substrate wafer 1 with the two epitaxial layers 2, 3 after this stage in the manufacturing process. The epitaxial layers are doped from the melt during the growth stage. The first epitaxial layer is n-conductive, the second epitaxial layer is p-conductive.

In the following stage of the process, the surface is frosted or roughened before deposition of the contact layers. It is therefore possible to use less etch-resistant metals, such as aluminum for example, for the contact layers.

Figure 2B:
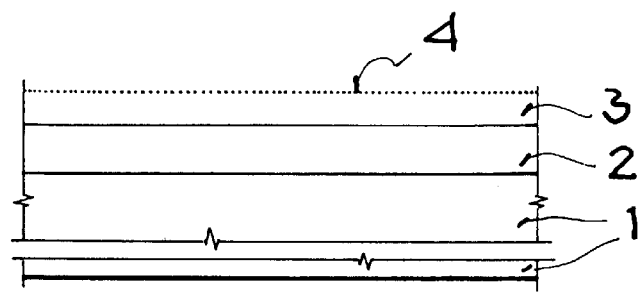
FIG. 2b shows the light emitting diode of FIG. 1 in a second stage of its manufacture.

The frosting process is designed such that it can be performed without any particular measures at a relatively low temperature under normal laboratory conditions. After cleaning thoroughly with alkali cleaning agent and an additional weak etching agent (approx. 1 µm material removed) the GaP semiconductor wafers are frosted or rough-etched in a mixture made up of equal volumes of $H_3PO_4$, HCl and $CH_3COOH$. Each of the acids must be in concentrated form. The temperature of the frost etchant is between 25 and 40° C. The semiconductor wafers are kept in the frost etchant for a period of about 5 to 10 minutes. It is advantageous that the frosting can take place in an open basin because the composition of the frost etchant and the low temperatures result in no vapors that could endanger the health or cause corrosion. The duration of etching is selected such that a fine frosted surface 4 is produced on the semiconductor wafers having a roughness depth of less than 1 µm. FIG. 2b shows the semiconductor wafer at the end of this stage in the process.

Figure 2C:
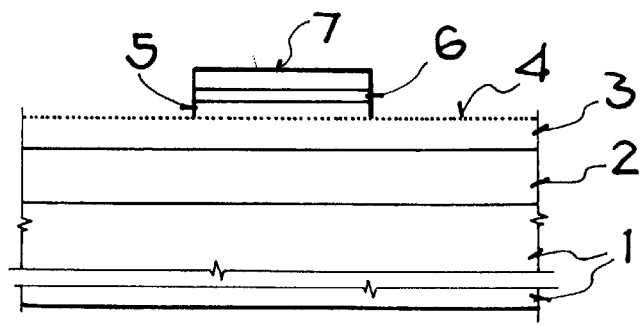
FIG. 2c shows the light emitting diode of FIG. 1 in a third stage of its manufacture.

The semiconductor wafer is now provided with a first contact layer 5 of gold-zinc on the frosted surface 4 of the p-conductive wafer side in specified partial areas. Since, when the diode is later assembled, the contact layer is joined with the help of a bonding process to a terminal pin on the housing through one or several thin bonding wires of gold or aluminum, and since damage to the contact layer and the semiconductor crystal must be avoided while the wire is being bonded, the first contact layer 5 is reinforced by one or several other contact layers 6, 7. In general, aluminum is preferred to gold as reinforcing layer because it makes assembly easier. Between the first contact layer 5 of gold-zinc and the third contact layer 7 of aluminum provided for the purposes of reinforcement, a second contact layer 6, made preferably of titanium-tungsten-nitride, is provided as diffusion barrier that prevents the gold-zinc layer (first contact layer 5) and the aluminum reinforcement (third contact layer 7) from becoming alloyed while the contact layer arrangement is being tempered. The arrangement after this stage of the process is shown in FIG. 2c. Instead of aluminum, an AlSi alloy can also be used as material for the third contact layer 7. AlSi alloys are more resistant to corrosion than pure aluminum.

Figure 2D:
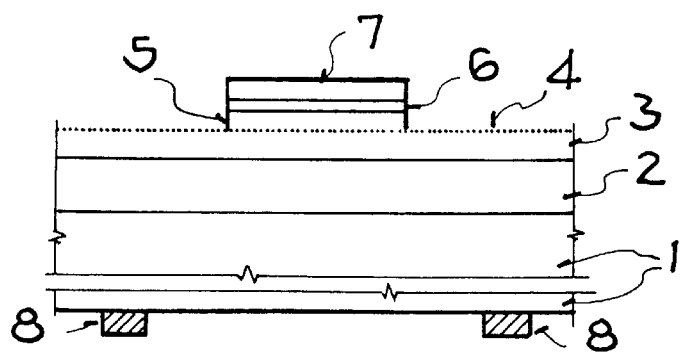
FIG. 2d shows the light emitting diode of FIG. 1 in a fourth stage of its manufacture.

In the next and final stage of the wafer process, the n-conductive wafer reverse side is provided with a metallization (8). This metallization can be performed over the whole surface, but it is preferably performed only partially and is, for example, of gold-germanium. After deposition and structuring of the contact layers on the front and reverse sides, the contacts are tempered in a temperature process in order to obtain the ohmic properties. The arrangement after this stage of the process is shown in FIG. 2d.

The diodes are then separated by dividing up the semiconductor wafer and assembled appropriately.

The graph in FIG. 3 shows the relationship between etched depth and the etching time at different temperatures for the etching solution, which consists of a mixture of phosphoric acid, hydrochloric acid and acetic acid, and for a (1 1 1) GaP surface. These acids have a volumetric ratio of 1:1:1. In a series of experiments using mixtures of phosphoric acid and hydrochloric acid, it has been found that with (1 1 1) GaP, surface roughnesses comparable to those achieved with nearly boiling concentrated hydrochloric or hydrofluoric acid can be obtained even at temperatures slightly over room temperature. However, owing to the high viscosity of the phosphoric acid and the low process temperature, no disturbing chloric acid or fluoric acid vapors are produced. When viewed with great magnification, it can be seen that both those surfaces treated with hydrochloric or hydrofluoric acid and those treated with the mixture of phosphoric acid and hydrochloric acid are densely covered with pyramids that are regular and adjacent without gaps and which all end with a sharp peak. By adding acetic acid to the mixture of phosphoric acid and hydrochloric acid, the development of these sharp-pointed pyramids can be prevented and the desired fine frosted surface with a roughness depth of less than 1 $\mu$m results instead. As the graph in FIG. 3 shows, the amount of material removed by the etching solution is little. Even at a temperature of 50° C. and an etching time of 30 minutes, the mean depth of removal is only in the region of 500 nm. The low rate of dissolution is an indication of the existence of inhibition phenomena when etching takes place. Since the depth of etching is also proportional to the square root of the etching time, it can be concluded that at least some part of the etching reaction is diffusion-controlled. It is presumably the rate at which reactant products can be removed that limits the etching rate.

Figure 4:
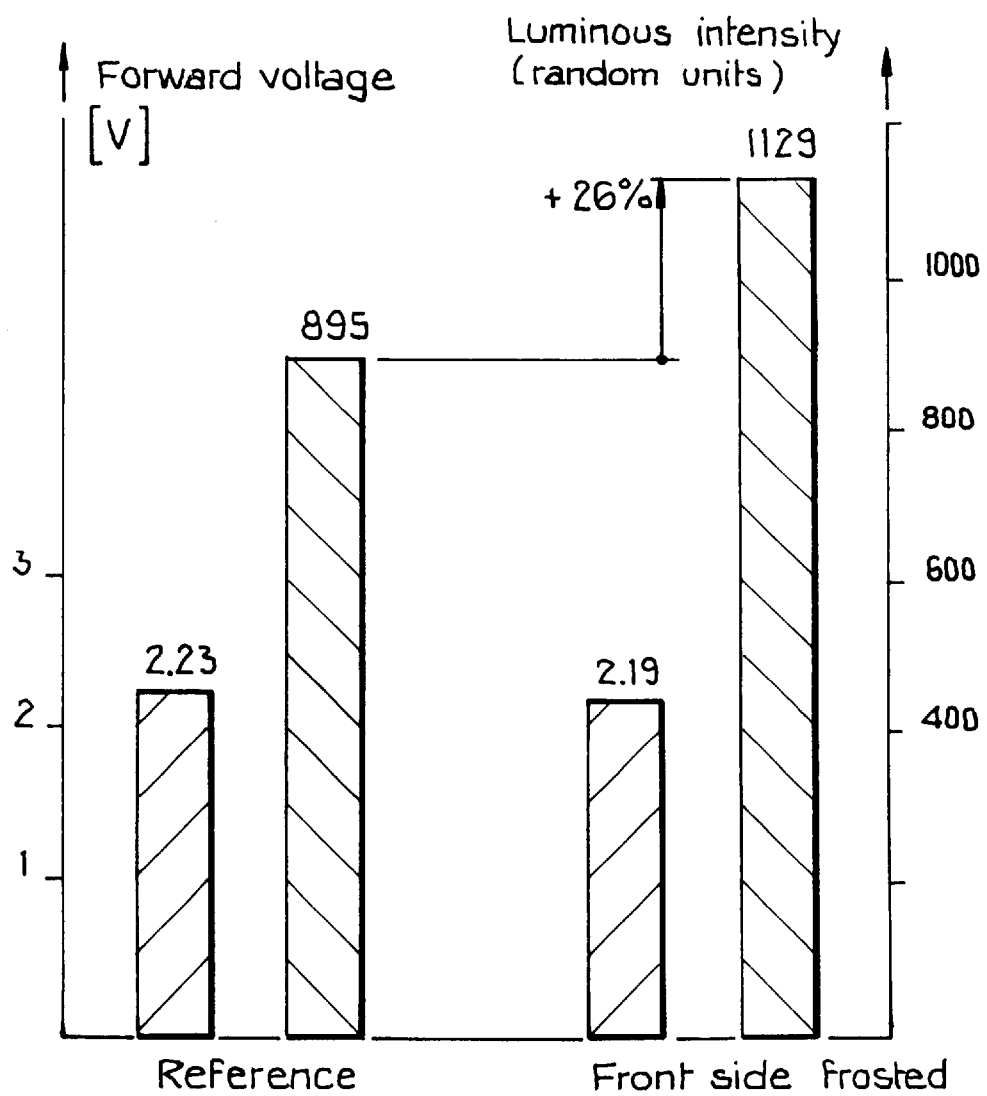
FIG. 4 shows the forward voltage and the luminous intensity of a yellow-green emitting nitrogen-doped GaP chip for diodes with frosted surface as compared with conventional diodes.

By frosting or roughening the front side of the semiconductor substrate wafer, the external quantum efficiency can be improved by about 25%. This can be seen in the chart in FIG. 4 which shows the forward voltage and luminous intensity data for a conventional GaP:N light emitting diode chip for the green spectral range compared with the data for a chip with frosted front side. The luminous intensity with a forward current of 20 mA could be improved by 26% from 895 to 1129 (random units). At the same time, the forward voltage dropped from 2.23 V to 2.19 V. Tests have also shown that the life of the diodes with frosted front side is not adversely affected as compared with conventional diodes.

By means of the method described above for frosting or rough-etching the front side of light emitting diodes, it is possible to increase the luminous efficiency by about 25%. Since the frost-etching process is performed before the contacting of the front side, this method can also be applied if aluminum is to be used as contact material. Since the frosting is still restricted to the front side of the diodes and the electrically active pn junction emerges to the surface at the lateral areas, the life of the diodes is not adversely affected by the method.

What is claimed is:

1. Method for manufacturing a light emitting diode with the following process steps:

preparing a substrate;

producing on the substrate a series of layers which include a pn junction that generates light radiation;

depositing contact layers on an outer surface of the series of layers including the pn junction that generates the radiation and on a rear side of the substrate;

tempering the contact layers; and wherein the outer surface of the layers including the pn junction that generates the light radiation is fine-frosted, whereby the luminous intensity of the light-emitting diode is increased, before deposition of the contact layers.

2. Method in accordance with claim 1, wherein the substrate is made of (1 1 1)-oriented gallium phosphide.

3. Method in accordance with claim 2, wherein the layers including the pn transition that generates the light radiation is made of gallium phosphide.

4. Method in accordance with claim 3, wherein the fine-frosting of the only surface of the layers including the pn junction that generates the radiation is performed by wet chemical etching with a mixture of phosphoric acid, hydrochloric acid and acetic acid.

5. Method in accordance with claim 4, wherein the ratio of phosphoric acid:hydrochloric acid:acetic acid is 1:1:1.

6. Method in accordance with claim 5, wherein a roughness depth of the fine-frosting outer surface is less than 1 $\mu$m.

7. Method in accordance with claim 1, wherein the contact layers on the surface of the layers including the pn junction that generates the radiation and on the rear side of the substrate are tempered in a single process step.

8. A method of manufacturing a light emitting diode including the following steps in sequence:

providing a semiconductor substrate;

forming a series of semiconductor layers including a pn junction which generates light radiation on a front surface of the substrate;

fine-frosting an outer surface of the series of layers, whereby the luminous intensity of the light emitting diode will be increased;

forming a first ohmic contact layer on the fine-frosted outer surface of the series of layers, and a second contact layer on a rear surface of the substrate; and, tempering the first and second contact layers.

9. A method as defined in claim 8, wherein the step of fine-frosting comprises etching the outer surface.

10. A method as defined in claim 9, wherein the step of fine-frosting comprises etching the outer layer to a roughness depth of less than 1 $\mu$.

11. A method as defined in claim 9, wherein: the substrate is made of (111)-oriented gallium phosphide; the layers are made of gallium phosphide; and the step of etching is performed with a mixture of phosphoric acid, hydrochloric acid and acetic acid.

12. A method as defined in claim 11, wherein the ratio of the respective acids is 1:1:1.

13. A method as defined in claim 9, wherein the step of roughening comprises etching the outer layer to a roughness depth of less than 1 $\mu$.

* * * * *